(12) United States Patent
Nishimura et al.

(10) Patent No.: US 6,475,901 B2
(45) Date of Patent: Nov. 5, 2002

(54) METHOD FOR MANUFACTURING SEMICONDUCTOR DEVICE HAVING A MULTI-LAYER INTERCONNECTION

(75) Inventors: Hidetomo Nishimura, Miyagi (JP); Makiko Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/984,321

(22) Filed: Oct. 29, 2001

(65) Prior Publication Data

US 2002/0072221 A1 Jun. 13, 2002

(30) Foreign Application Priority Data

Dec. 13, 2000 (JP) ........................................ 2000-379004

(51) Int. Cl.⁷ .......................................... H01L 21/4763
(52) U.S. Cl. ...................... 438/626; 438/692; 438/696; 438/699; 438/628
(58) Field of Search ................................ 438/690–699, 438/626–628

(56) References Cited

U.S. PATENT DOCUMENTS

| | | | | |
|---|---|---|---|---|
| 5,817,571 A | * | 10/1998 | Yu et al. | 438/622 |
| 6,048,800 A | * | 4/2000 | Nagashima et al. | 438/633 |
| 6,218,284 B1 | * | 4/2001 | Liu et al. | 438/435 |

FOREIGN PATENT DOCUMENTS

| | | |
|---|---|---|
| JP | 61-181192 | 6/1994 |
| JP | 9-266207 | 10/1997 |

* cited by examiner

Primary Examiner—Jey Tsai
(74) Attorney, Agent, or Firm—Volentine Francos, P.L.L.C.

(57) ABSTRACT

A semiconductor device including a semiconductor substrate, and a plurality of first interconnects formed over the semiconductor substrate. A first insulating layer covers the plurality of first interconnects, and a second insulating layer is formed between the plurality of first interconnects. The second insulating layer has substantially the same height as the plurality of first interconnects. An intermediate insulating layer is formed over the second insulating layer.

20 Claims, 8 Drawing Sheets

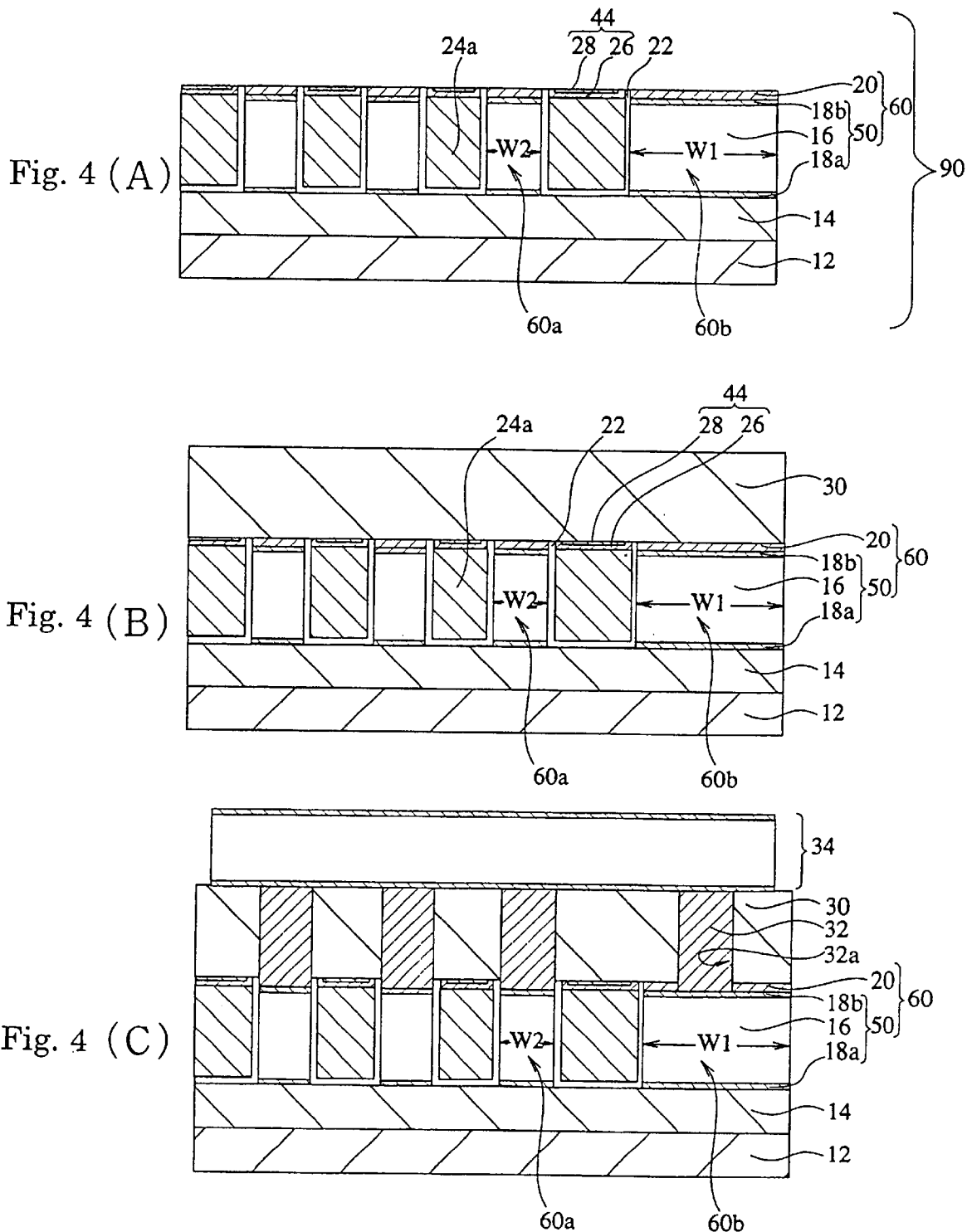

Figure 1:
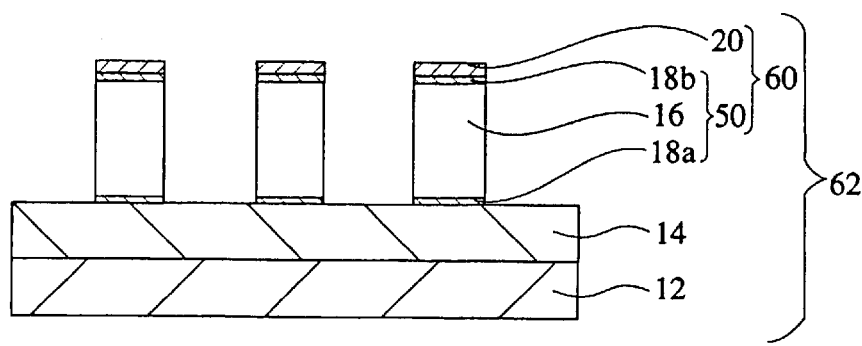
Figure 1:
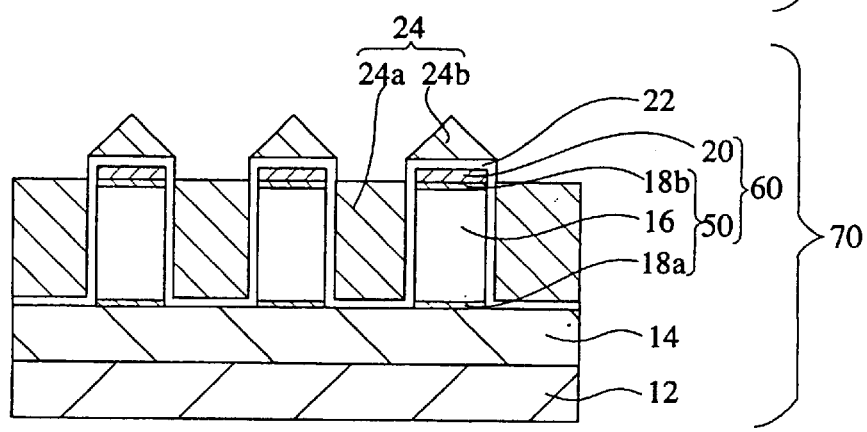
Figure 1:
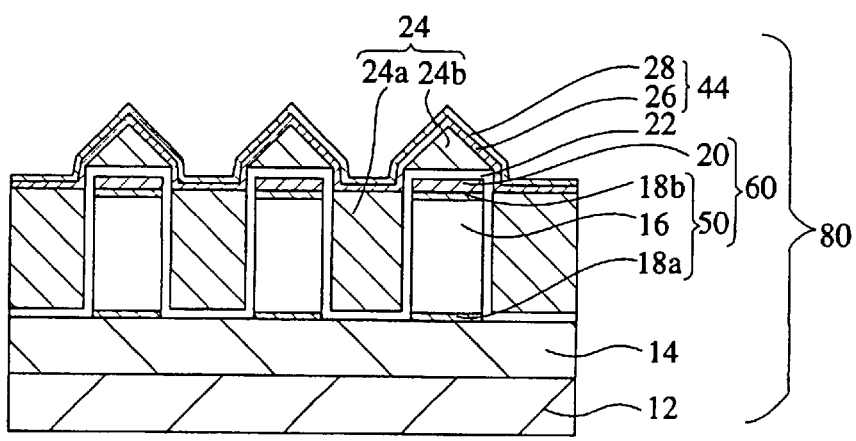

METHOD FOR MANUFACTURING SEMICONDUCTOR DEVICE HAVING A MULTI-LAYER INTERCONNECTION

BACKGROUND OF THE INVENTION

1. Field of the Invention

The present invention relates to a method for manufacturing a semiconductor device, and in particular, the present invention relates to the formation of a multi-layer interconnection of a semiconductor device.

2. Description of the Related Art

With the miniaturization of semiconductor devices, it has become necessary to form multi-layer interconnection structures. The width of corresponding interconnects and the spacing between such interconnects of a lower layer interconnect pattern are especially reduced with the miniaturization of semiconductor devices. To provide an interlayer insulating film for a semiconductor device which includes multi-layer interconnect patterns, an insulating film made of silicon oxide which has a reduced dielectric constant is primarily used for the purpose of reducing parasitic capacitance between an upper (or overlying) interconnect layer and a lower (or underlying) interconnect layer, as well as between interconnects in the same layer. A High Density Plasma (HDP) CVD method is used to fill a gap between interconnects with the interlayer insulating film.

However, fluorine, which is included in the interlayer insulating film (silicon oxide layer) to reduce the dielectric constant, corrodes the interconnects. Hydrogen fluoride is formed by hydrolysis of fluorine with the moisture content of air, and interconnects, which contact to the silicon oxide layer, are corroded by the hydrogen fluoride. A fluoride gas is also formed in a process after the formation of the silicon oxide layer, and this also corrodes the interconnects. Therefore, the interconnects must be prevented from touching the silicon oxide layer which includes fluorine.

For gap filling, HDP CVD processing is a simultaneous deposition/etching process in which loosely deposited silicon oxide films are sputtered off by reactive ions and radicals during deposition. Fluorine in the etched silicon oxide layer is diffused into the silicon oxide layer between interconnects. Therefore, the quality of the silicon oxide layer filled in gaps of the interconnects is different from the silicon oxide layer of other portions. That is, the quality of silicon oxide layer filled in gaps is inferior to the silicon oxide layer of other portions with respect to moisture resistance.

Because of the above described problems, impurity (fluorine) concentration must be low, and the HDP CVD method costs about three times more than the methods using a parallel plate CVD apparatus.

Also, the case where an overlay shift occurs during photo lithography, a short-circuit is formed between the contact and interconnect.

SUMMARY OF THE INVENTION

According to one aspect of the present invention, a semiconductor device generally includes a semiconductor substrate, a plurality of first interconnects formed over the semiconductor substrate, a first insulating layer covering the plurality of first interconnects, a second insulating layer formed between the plurality of first interconnects, the second insulating layer having substantially the same height as the plurality of first interconnects, and an intermediate insulating layer formed over the second insulating layer.

BREIF DESCRIPTION OF THE DRAWINGS

FIGS. 1(A)–1(C) are cross sectional views showing a method of manufacturing the semiconductor device of a first preferred embodiment.

Figure 2A:
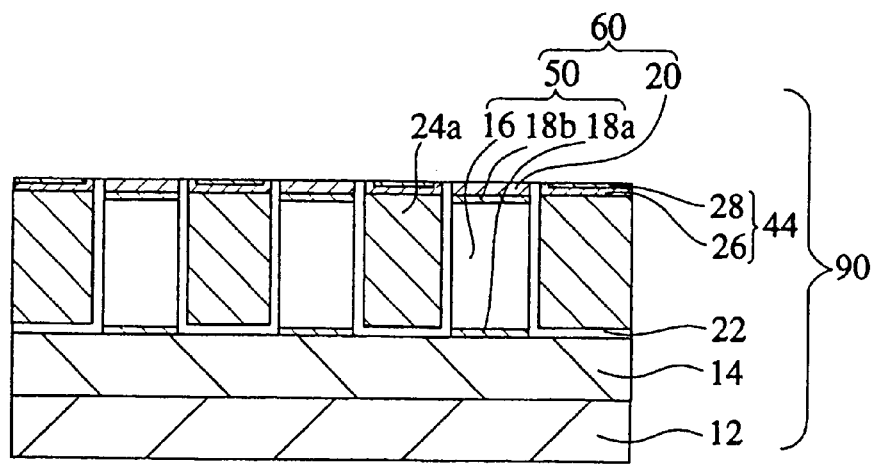
Figure 2B:
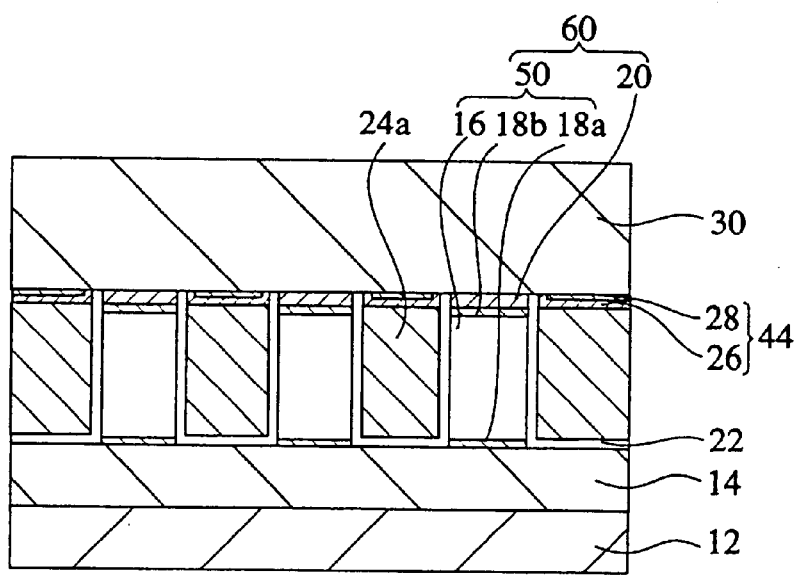
Figure 2C:
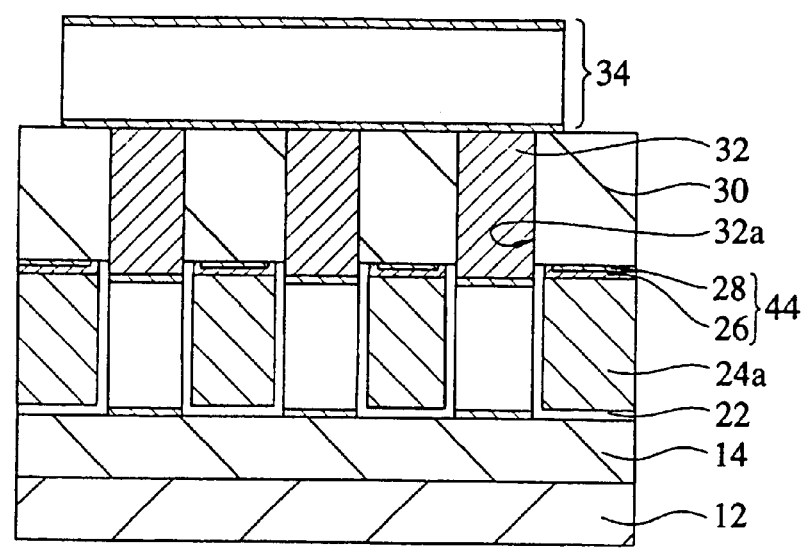

FIGS. 2(A)–2(C) are cross sectional views showing a semiconductor device and a method of manufacturing the semiconductor device of the first preferred embodiment.

Figure 3:
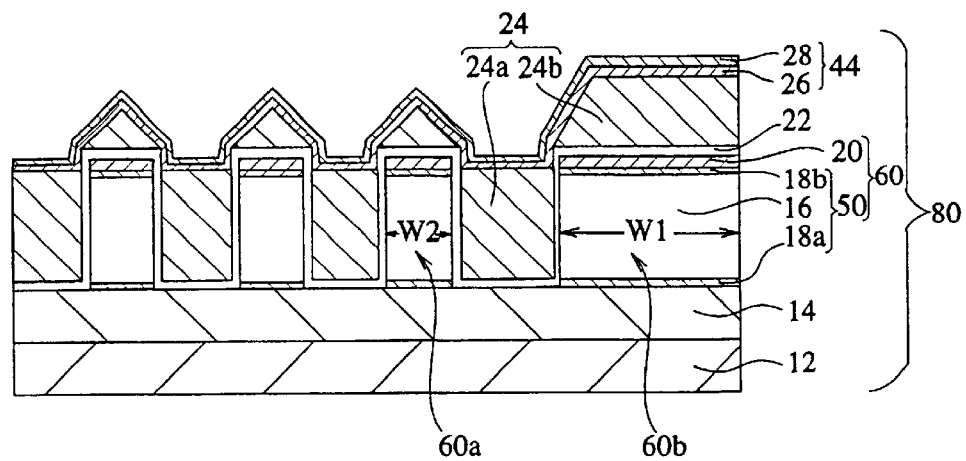
Figure 3:
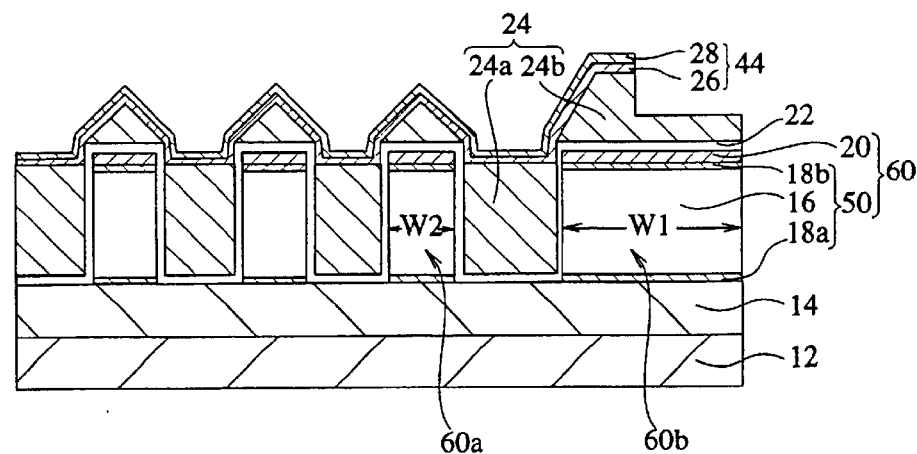
Figure 3:
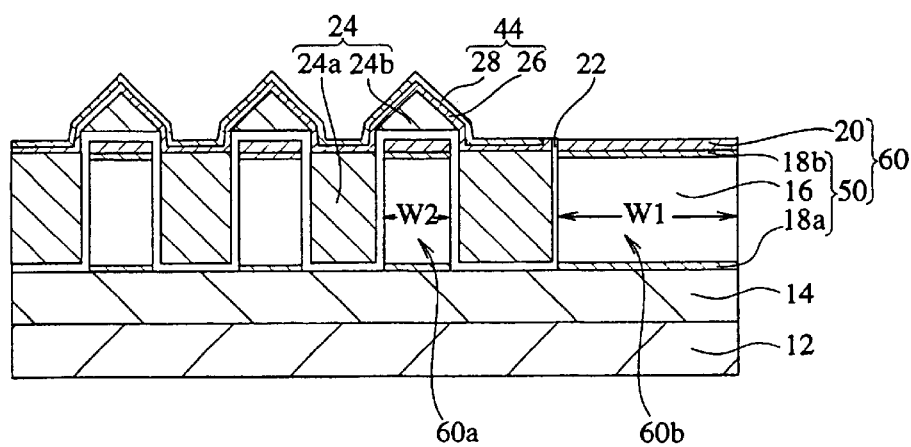

FIGS. 3(A)–3(C) are cross sectional views showing a method of manufacturing the semiconductor device of a second preferred embodiment.

FIGS. 4(A)–4(C) are cross sectional views showing the method of manufacturing the semiconductor device of the second preferred embodiment.

Figure 5A:
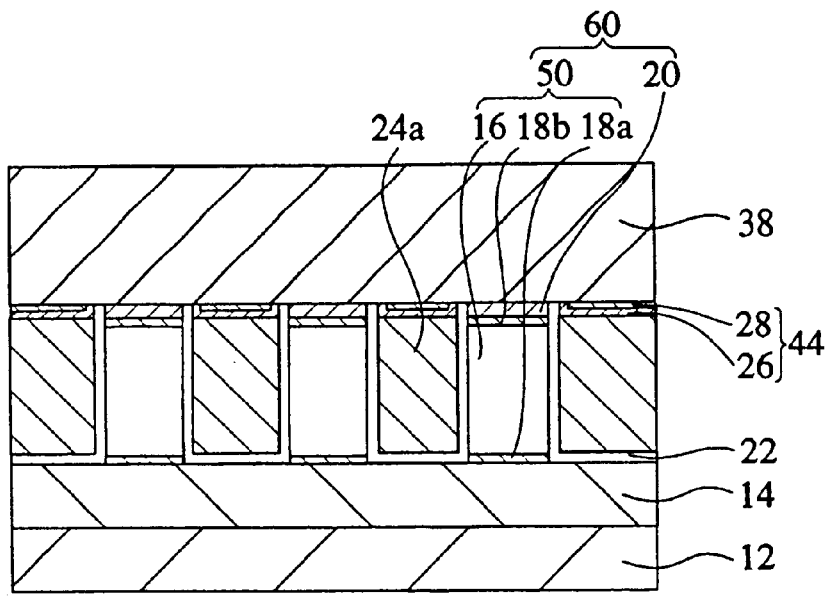
Figure 5B:
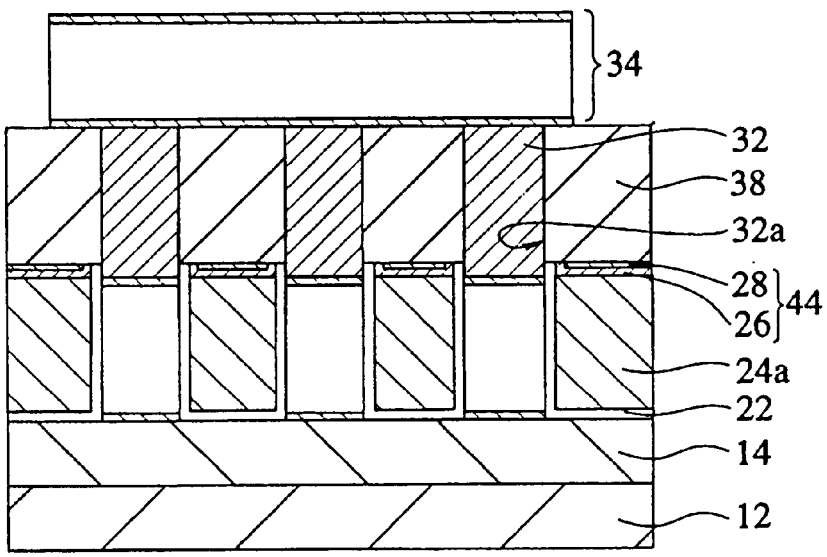

FIGS. 5(A)–5(B) are cross sectional views showing and a method of manufacturing the semiconductor device of a third preferred embodiment.

Figure 6:
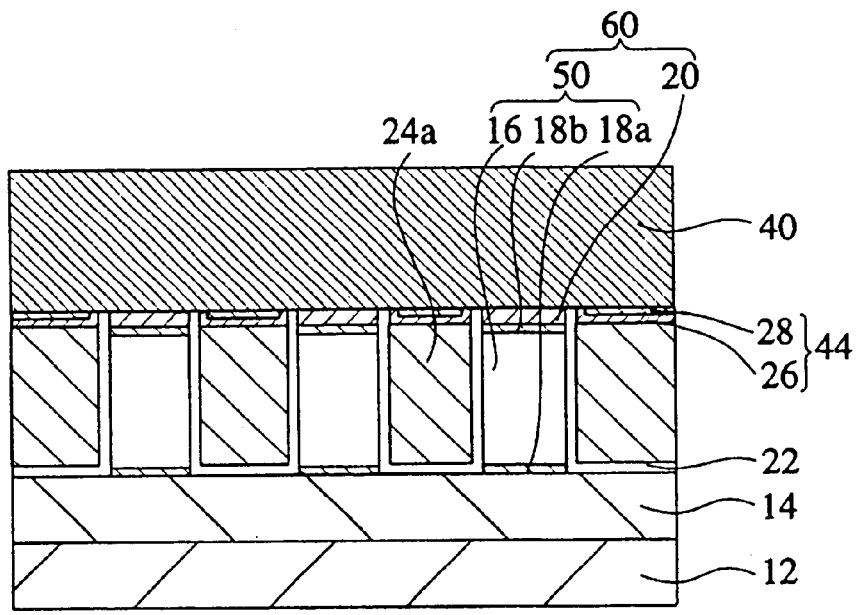
Figure 6:
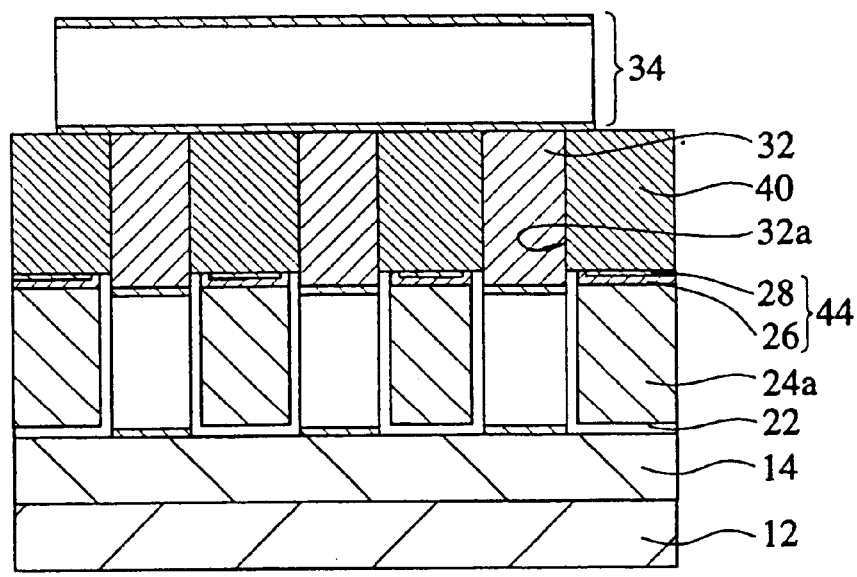

FIGS. 6(A)–6(B) are cross sectional views showing and a method of manufacturing the semiconductor device of a fourth preferred embodiment.

Figure 7:
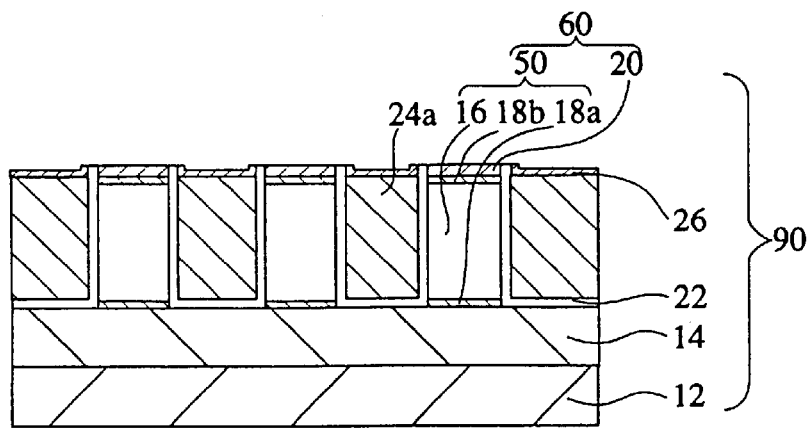
Figure 7:
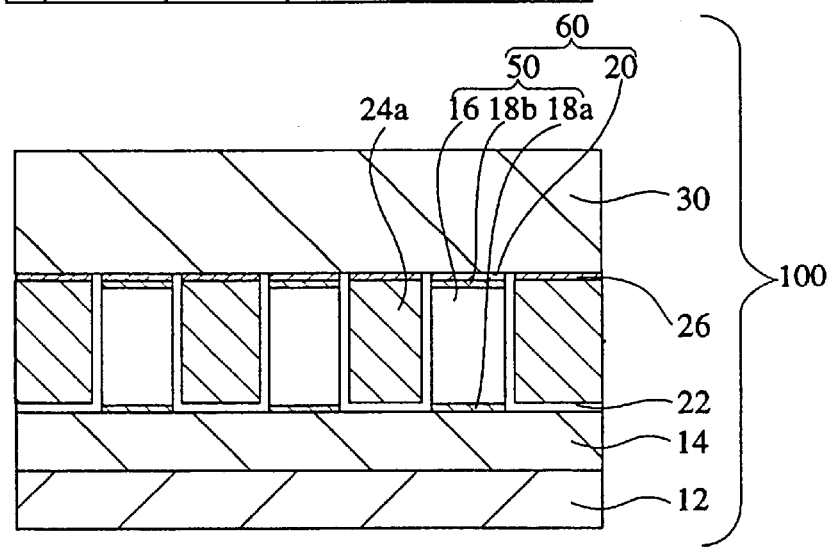
Figure 7:
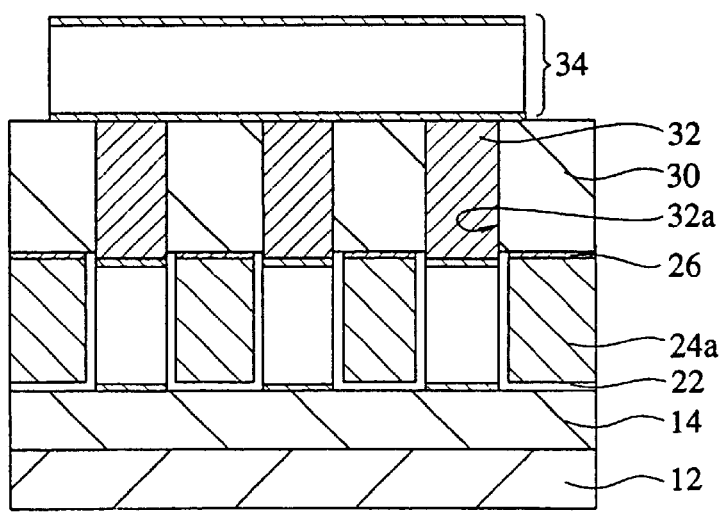

FIGS. 7(A)–7(C) are cross sectional views showing and a method of manufacturing the semiconductor device of a fifth preferred embodiment.

Figure 8A:
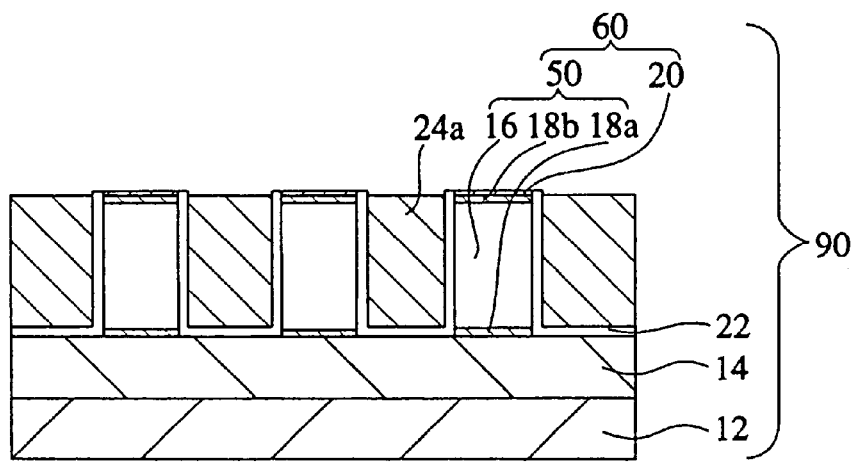
Figure 8B:
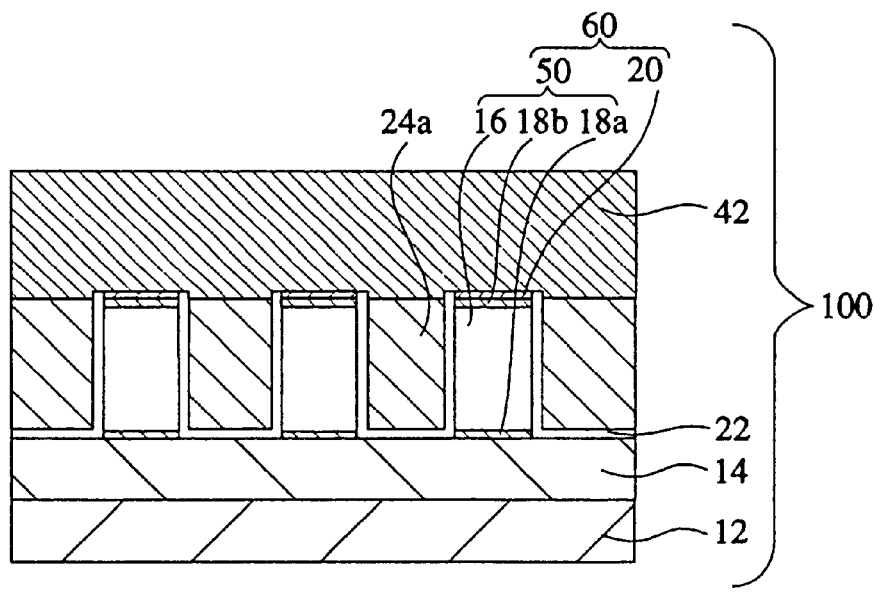
Figure 8C:
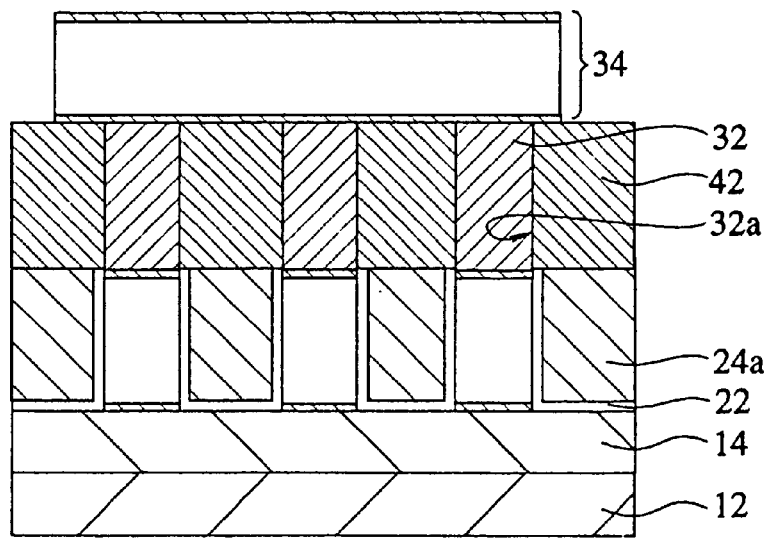

FIGS. 8(A)–8(C) are cross sectional views showing and a method of manufacturing the semiconductor device of a sixth preferred embodiment.

DETAILED DESCRIPTION OF THE PREFERRED EMBODIMENTS

Preferred embodiments of the present invention are described below with reference to the drawings.

FIGS. 1(A)–1(C) and FIGS. 2(A)–2(C) are cross sectional views for explaining a semiconductor device and a method of manufacturing the semiconductor device of the first preferred embodiment.

The semiconductor device of the first preferred embodiment has a semiconductor substrate 12, a first silicon oxide layer 14, a first interconnect 50, a first insulating layer 22, a second insulating layer 24, an adhesive layer 26, a support insulating layer 28, a intermediate insulating layer 30, a conductive plug 32, and a second interconnect 34 as shown in FIG. 2(C). The first insulating layer 22 is made of silicon oxide (second silicon oxide layer) in the first preferred embodiment. The second insulating layer 24 is made of a fluorine doped silicon oxide layer 24a (Fluorinated Silicate Glass, FSG herein after) in the first preferred embodiment. The adhesive layer 26 is made of silicon oxide (third silicon oxide layer) in the first preferred embodiment. The support insulating layer 28 is made of a silicon nitride layer in the first preferred embodiment.

The first silicon oxide layer 14 is formed over the semiconductor substrate 12. The first interconnect 50 is formed over the first silicon oxide layer 14. The first interconnect includes first and second barrier metal layers 18a, 18b and a metal layer 16. The first barrier metal layer 18a is formed over the first silicon oxide layer 14. The metal layer 16, which includes aluminum, is formed over the first barrier metal layer 18a. The second barrier metal layer 18b is formed over the metal layer 14. The barrier layers 18a and 18b may be a single layer or a multi-layer of Ti, Ti/TiN or other barrier material. The first interconnect 50, which includes the metal layer 16 and the barrier layers 18a and 18b, has a thickness of about 400 nm~700 nm. A silicon oxide layer 20 is formed as a mask over the first interconnect 50 using plasma CVD. The thickness of the silicon oxide layer 20 is about 50 nm in the first preferred embodiment.

The first interconnect is etched using the silicon oxide layer 20 as a mask. An etching is performed until a surface of the first silicon oxide layer 14 is exposed as shown FIG. 1(A).

The second silicon oxide layer 22 is formed over the first silicon oxide layer 14 and the first interconnect 50 as the first insulating layer. The second silicon oxide layer 22 covers side surfaces of the first interconnect 50 and the surface of the first silicon oxide layer 14, and has a thickness of about 50 nm~100 nm. The second silicon oxide layer 22 protects the first interconnect 50 and the first silicon oxide layer 14 from the fluorine included in the FSG layer 24, and improves an adhesion to the FSG layer 24.

A second insulating layer (FSG layer) 24 is deposited over the second silicon oxide layer 22 via High Density Plasma Chemical Vapor Deposition (HDP-CVD). For example, the FSG layer is formed using a mixed gas of SiH4 (flow rate: 30 sccm), SiF4 (flow rate: 80 sccm), O2 (flow rate: 183 sccm) and Ar (flow rate: 153 sccm) and a plasma power of 2000 W~5000 W. The FSG layer 24 is formed to fill in gaps between first interconnects 50, and has approximately the same height as the first interconnect 50. A top surface of the FSG layer 24 is slightly below a top surface of the second silicon oxide layer 22 as shown in FIG. 1(B). The reason why the top surface of the FSG layer 24 is slightly below the top surface of the second silicon oxide layer 22 is described later. The FSG layer 24 is also deposited over the first interconnect 50. A reference numeral 24b is applied to a portion of the FSG layer 24 over the first interconnect 50 in the drawings. The portion 24b has a triangular appearance in cross section as shown in FIG. 1(B). The portion 24b is removed by Chemical Mechanical Polishing (CMP), which is described later.

The adhesion layer (third silicon oxide layer) 26 is formed over the FSG layer 24. The support insulating layer 28 is formed over the adhesion layer 26.

The adhesion layer 26 of the first preferred embodiment is a Si-rich NSG (Nondoped Silicate Glass: $Si_xO_2$) in the first preferred embodiment. The Si-rich NSG layer 26 captures fluorine from the FSG layer 24, and prevent the support layer 28 from peeling off. A Si composition ratio of the adhesion layer is 1.2 or more. That is to say, the x of the chemical formula $Si_xO_2$ is greater than 1.2 (x≧1.2). The Si-rich NSG layer 26 is deposited over the FSG layer 24 using a plasma CVD method, to the thickness of about 100 nm~200 nm. The support insulating layer 28 is deposited over the adhesion layer 26 using a plasma CVD method, to the thickness of about 100 nm~200 nm. The support insulating layer 28 is a silicon nitride (SiN) layer in the first preferred embodiment as shown in FIG. 1(C).

A polishing rate of the silicon nitride layer 28 is different from the FSG layer 24 when the CMP is performed. Therefore, an endpoint of the CMP is detected precisely, and unnecessary polishing is prevented.

Then, Chemical Mechanical Polishing is performed. CMP is performed from the upper side of the substrate 12. The support insulating layer 28 is removed partly. More precisely, a portion of the support insulating layer 28 over the first interconnect is removed, and a portion of the support insulating layer 28 between the first interconnects 50 remains. A polishing rate of the SiN layer 28 is lower than the FSG layer in the CMP process. Therefore, when the surface of the SiN layer 28 is exposed in the CMP process, the speed of polishing is reduced, and the endpoint is detected precisely. The first interconnect 50 is not polished in the CMP process as shown in FIG. 2(A). The top surface over the semiconductor substrate 12 is planarized in the CMP process.

The intermediate insulating layer 30 is formed over the planarized top surface using a parallel plate plasma CVD apparatus as shown in FIG. 2(B). The intermediate insulating layer is a silicon oxide layer which does not include fluorine. A thickness of the intermediate insulating layer 30 is about 500 nm.

A photolithography and dry etching technique is used, and the contact hole 32a is formed in the intermediate insulating layer 30. The top surface of the first interconnect 50 is exposed in this step. A titanium nitride (TiN) layer is deposited over the surface of the semiconductor substrate using a sputtering method, and the TiN layer covers side surfaces and a bottom surface of the contact hole 32a. A tungsten (W) layer is formed over the TiN layer using a CVD method. Then, the W layer and the TiN layer, except for the portion which is formed in the contact hole 32a, are removed using an etching or CMP. The conductive plug 32 is formed as described above. The second interconnect 34 is formed over the intermediate insulating layer 30 as shown in FIG. 2(C).

As described above, the support insulating layer 28, which remains over the FSG layer 24, works as a stopper layer during planarization by CMP in the first preferred embodiment.

Even if an overlay shift occurs in the photolithography process, the support insulating layer 28, which remains over the FSG layer 24, works as an etching stopper layer. Therefore, the conductive plug does not touch the FSG layer 24, and a short circuit between the conductive plug and the first interconnect 50 is prevented. That is, the case where the interconnects directly contact the FSG layer 24, corrosion or a short circuit can result due to the FSG layer absorbing moisture. Since the FSG layer 24 does not directly touch the interconnects in the first preferred embodiment, such corrosion or short circuiting of the interconnect is prevented.

According to the first preferred embodiment, the FSG layer 24 can be used as an insulating layer between interconnects 50, and the interconnects 50 are prevented from corrosion or short circuiting because of the second silicon oxide layer 22, the adhesion layer 26 and the support insulating layer 28. Therefore, the capacitance between interconnects is reduced, and the speed of the interconnect is improved.

A concentration of fluorine in the conventional FSG layer is about 2%. However, a concentration of fluorine in the FSG layer 24 of the first preferred embodiment is about 3~4%. The higher concentration of the fluorine of the first preferred embodiment reduces the dielectric constant.

The top surface over the semiconductor substrate is planarized before formation of the intermediate insulating layer 30. Therefore, the intermediate insulating layer 30 can be formed using a parallel plate plasma CVD apparatus, and the cost for manufacturing the semiconductor device can be reduced.

Second embodiment

FIGS. 3(A)–3(C) and FIGS. 4(A)–4(C) are cross sectional views showing a semiconductor device and a method of manufacturing the semiconductor device of a second preferred embodiment.

The formation of the support insulating layer 28 and the steps prior to the formation of the support insulating layer 28 are the same as those of the first embodiment, as shown in FIG. 3(A).

A variation of the interconnect width is present in the second preferred embodiment. As further shown in FIG.

3(A), the semiconductor device of the second preferred embodiment has a first interconnect width W1 and a second interconnect width W2, and W1 is greater than W2 (W1>W2).

When the FSG layer is formed by an HDP-CVD method, the FSG layer 24 thereof changes, corresponding to a lower pattern. This pattern is shown in detail in FIG. 3(A). It has been known that the FSG layer has tended to be deposited with a certain angle to the surface of lower electrode layer. When the width of the first interconnect is wider than a certain value, a flat surface is formed on the top portion of the FSG layer 24. On the other hand, as shown in FIG. 3(A), a vertex is made in the sectional shape of the FSG layer 24 if the width of the first interconnect is less than a certain value. If the vertex is made in the sectional shape of the FSG layer, the pressure of the CMP is concentrated on the vertex. On the other hand, if the surface of the FSG layer 24 is a flat top surface, the pressure thereof dispresses. As a result, the portion having the vertex is polished with great speed. In other words, a different polishing speed occurs according to the cross sectional shape of the FSG layer 24.

Therefore, the support insulating layer 28, the adhesion layer 26 and the FSG layer 24 over the wider interconnect are entirely or partly removed before CMP in the second preferred embodiment as shown in FIGS. 3(B) and 3(C). A mask is formed, which has an opening over the wide interconnect is formed, and an etching is performed. The support insulating layer 28, the adhesion layer 26 and the FSG layer 24 over the wider interconnect 50 does not have to be removed entirely as shown in FIG. 3(B). An entire thickness of FSG layer 24 may be removed as shown in FIG. 3(C).

The CMP process is performed in the same way as in the first preferred embodiment. The FSG layer 24 over the first interconnect 50 is entirely removed after the CMP as shown in FIG. 4(A). Subsequent steps are the same as the first preferred embodiment as shown in FIG. 4(B) and FIG. 4(C).

As described above, even if there is a width variation of the interconnects 50, the FSG layer over the first interconnect is properly removed in the second preferred embodiment.

Third embodiment

FIGS. 5(A)–5(B) are cross sectional views showing a semiconductor device and a method of manufacturing the semiconductor device of the third preferred embodiment. The Chemical Mechanical Polishing and the steps prior to the CMP are the same as those of the first embodiment. If there is a wide first interconnect, the FSG layer 24 is removed before the CMP in the same way as the second preferred embodiment.

In the third embodiment, a low dielectric constant layer 38 (for example a lightly fluorine doped silicon oxide layer which has a fluorine concentration ratio of less than 2%), a carbon doped silicon oxide layer) is used as an intermediate insulating layer 30. The low dielectric insulating layer 38 is formed over the silicon substrate 12 using a parallel plate plasma CVD apparatus. The thickness of the low dielectric constant layer 38 is about 500 nm in the third preferred embodiment.

In addition to the advantages of the other preferred embodiments, the semiconductor device of the third preferred embodiment has an advantage in that a capacitance between the first interconnect and the second interconnect is reduced. Therefore, a delay of signals is further reduced.

Fourth embodiment

FIGS. 6(A)–6(B) are cross sectional views showing a semiconductor device and a method of manufacturing the semiconductor device of the fourth preferred embodiment. The Chemical Mechanical Polishing and the steps prior to the CMP are the same as those of the first embodiment. If there is a wide first interconnect, the FSG layer is removed before the CMP in the same way as the second preferred embodiment.

In the fourth embodiment, a method for forming an intermediate insulating layer 40 is different from the first and second embodiments. That is, the intermediate insulating layer 40 is formed by a spin coating method in the fourth preferred embodiment.

In the fourth preferred embodiment, an inorganic or organic low dielectric layer 40 is coated after the CMP process using a spin coating apparatus. The thickness of the low dielectric constant layer 40 is about 500 nm in the fourth preferred embodiment. A curing to vaporize moisture in the spin coated inorganic or organic low dielectric layer 40 is performed. The strength of the low dielectric constant layer 40 is improved after the curing. Subsequent steps are the same as those of the other embodiments.

In addition to the advantages of the other preferred embodiments, the spin coating method has a lower manufacturing cost compared to the CVD method, and many kind of films can be deposited by the spin coating method. Therefore, process flexibility in forming the intermediate insulating layer 40 is improved.

Fifth embodiment

FIGS. 7(A)–7(C) are cross sectional views showing a semiconductor device and a method of manufacturing the semiconductor device of the fifth preferred embodiment. The Chemical Mechanical Polishing and the steps prior to the CMP are the same as those of the first embodiment. If there is a wide first interconnect, the FSG layer is removed before the CMP in the same way as the second preferred embodiment.

In the fifth preferred embodiment, the support insulating layer (SiN) 28 is removed after the CMP as shown in FIG. 7(A). A wet etching using hot phosphoric acid or a dry etching is performed after the CMP.

Then, the intermediate insulating layer 30 and the contact hole 32a are formed in the same way as the other embodiments, and subsequent steps are the same as those of the other embodiments.

In addition to the advantages of the other embodiments, the SiN layer 28 is removed before the formation of the contact hole. Therefore, the capacitance between the first interconnect and the second interconnect is further reduced.

Sixth embodiment

FIGS. 8(A)–8(C) are cross sectional views showing a semiconductor device and a method of manufacturing the semiconductor device of the sixth preferred embodiment. The formation of the adhesive layer 26 and the steps, prior to the formation of the adhesive layer 26 are the same as those of the first embodiment.

In the sixth preferred embodiment, a heat treatment is performed at 400° C. for 15 minutes before the formation of the support insulating layer 28. Then, the support insulating layer 28 is formed over the adhesive layer 26. If there is a wide first interconnect, the FSG layer is removed before the CMP in the same way as the second preferred embodiment.

The support insulating layer (SiN) 28 and the adhesive layer 26 are removed after the CMP as shown in FIG. 8(A). A wet etching using hot phosphoric acid or a dry etching is performed after the CMP, and the support insulating layer 28 is removed. A dry etching is performed, and the adhesive layer 26 is removed.

Then, the intermediate insulating layer (spin coated lower dielectric layer) 42 and the contact hole 32a are formed in the same way of the fourth embodiments.

The spin coated lower dielectric layer is an organic layer 42 in the sixth preferred embodiment.

A first etching to etch the organic layer 42 is performed. A main component of a gas, which is used in the first etching, is $O_2$ in the sixth preferred embodiment. A second etching to etch the silicon oxide layer, which is formed over the first interconnects 50, is then performed. A main component of a gas, which is used in the second etching, is $C_2F_6$ in the sixth preferred embodiment. Subsequent steps are the same as those of the other embodiments.

In addition to the advantages of the other embodiments, the SiN layer 28 and the silicon oxide layer 26 are removed before the formation of the contact hole. Therefore, the capacitance between the first interconnect and the second interconnect is further reduced.

What is claimed is:

1. A method for manufacturing a semiconductor device, comprising:
    forming a plurality of interconnects of substantially same height over a silicon substrate;
    forming a first insulating layer over the plurality of interconnects, the first insulating layer covering top and side surfaces of the plurality of interconnects;
    forming a second insulating layer on the first insulating layer over the top surfaces and between the plurality of interconnects, the second insulating layer having substantially a same thickness as the plurality of interconnects;
    forming an adhesive layer over the second insulating layer;
    forming a support insulating layer over the second insulating layer,
    the adhesive layer and the support insulating layer being formed as substantially horizontal layers between the plurality of interconnects and as substantially non-horizontal layers over the top surfaces of the plurality of interconnects;
    polishing the second insulating layer, the adhesive layer and the support insulating layer that are formed over the top surfaces of the plurality of interconnects; and
    forming an intermediate insulating layer over the second insulating layer.

2. The method for manufacturing a semiconductor device according to claim 1, wherein said first insulating layer is formed as a non-doped silicon oxide layer, said second insulating layer is formed as a fluorinated silicon oxide layer, said adhesive layer is formed as a non-doped silicon oxide layer, and said support insulating layer is formed as a silicon nitride layer.

3. The method for manufacturing a semiconductor device according to claim 1, further comprising partly removing the second insulating layer, the adhesive layer and the support insulating layer before polishing.

4. The method for manufacturing a semiconductor device according to claim 1, further comprising removing the support insulating layer before forming the intermediate insulating layer.

5. The method for manufacturing a semiconductor device according to claim 1, further comprising removing the adhesive layer and the support insulating layer before forming the intermediate insulating layer.

6. The method for manufacturing a semiconductor device according to claim 1, further comprising performing a heat treatment before forming the support insulating layer.

7. The method for manufacturing a semiconductor device according to claim 1, wherein said intermediate insulating layer is formed using a parallel plate plasma CVD apparatus.

8. The method for manufacturing a semiconductor device according to claim 1, wherein said intermediate insulating layer is formed using a spin coating method.

9. The method for manufacturing a semiconductor device according to claim 1, wherein said intermediate insulating layer is formed as an organic layer.

10. The method for manufacturing a semiconductor device according to claim 1, wherein said intermediate insulating layer is formed as a fluorinated silicate glass layer.

11. The method for manufacturing a semiconductor device according to claim 1, wherein said intermediate insulating layer is formed as a carbon doped silicate glass layer.

12. The method for manufacturing a semiconductor device according to claim 1, wherein said adhesive layer is formed as $Si_xO_2$ layer, where x is at least 1.2.

13. A method for manufacturing a semiconductor device, comprising:
    forming a plurality of interconnects over a silicon substrate;
    forming a first insulating layer over the plurality of interconnects, the first insulating layer covering top and side surfaces of the plurality of interconnects;
    forming a second insulating layer on the first insulating layer over the top surfaces and between the plurality of interconnects, so that upper sidewalls of the first insulating layer on the side surfaces of the plurality of interconnects are exposed;
    forming an adhesive layer over the second insulating layer and on the exposed upper sidewalls of the first insulating layer;
    forming a support insulating layer over the second insulating layer;
    polishing the second insulating layer, the adhesive layer and the support insulating layer that are formed over the top surfaces of the plurality of interconnects; and
    forming an intermediate insulating layer over the second insulating layer.

14. The method for manufacturing a semiconductor device according to claim 13, further comprising partly removing the second insulating layer, the adhesive layer and the support insulating layer before polishing.

15. The method for manufacturing a semiconductor device according to claim 13, further comprising removing the support insulating layer before forming the intermediate insulating layer.

16. The method for manufacturing a semiconductor device according to claim 13, further comprising removing the adhesive layer and the support insulating layer before forming the intermediate insulating layer.

17. The method for manufacturing a semiconductor device according to claim 13, further comprising performing a heat treatment before forming the support insulating layer.

18. The method for manufacturing a semiconductor device according to claim 13, wherein said intermediate insulating layer is formed using a parallel plate plasma CVD apparatus.

19. The method for manufacturing a semiconductor device according to claim 13, wherein said intermediate insulating layer is formed using a spin coating method.

20. The method for manufacturing a semiconductor device according to claim 13, wherein the adhesive layer and the support insulating layer are formed as substantially horizontal layers between the plurality of interconnects and as substantially non-horizontal layers over the top surfaces of the plurality of interconnects.

* * * * *